US009998099B2

(12) United States Patent
Su et al.

(10) Patent No.: US 9,998,099 B2
(45) Date of Patent: Jun. 12, 2018

(54) FEED-FORWARD BIAS CIRCUIT

(71) Applicant: QUALCOMM Incorporated, San Diego, CA (US)

(72) Inventors: Wenjun Su, San Diego, CA (US); Chulkyu Lee, San Diego, CA (US); Le Zhang, Shanghai (CN); Guangming Yin, Newport Coast, CA (US)

(73) Assignee: QUALCOMM Incorporated, San Diego, CA (US)

( * ) Notice: Subject to any disclaimer, the term of this patent is extended or adjusted under 35 U.S.C. 154(b) by 109 days.

(21) Appl. No.: 14/384,374

(22) PCT Filed: May 23, 2014

(86) PCT No.: PCT/CN2014/078223
§ 371 (c)(1),
(2) Date: Sep. 10, 2014

(87) PCT Pub. No.: WO2015/176295
PCT Pub. Date: Nov. 26, 2015

(65) Prior Publication Data
US 2017/0077907 A1    Mar. 16, 2017

(51) Int. Cl.
*G05F 1/00*    (2006.01)
*H02M 3/07*    (2006.01)
(Continued)

(52) U.S. Cl.
CPC ............... *H03K 3/011* (2013.01); *G05F 1/00* (2013.01); *G05F 3/262* (2013.01); *H02M 3/07* (2013.01);
(Continued)

(58) Field of Classification Search
CPC ...... H03K 3/011; H03K 5/159; H03K 17/145; H03K 19/00384; H03K 2217/0018; G05F 1/00; G05F 3/262; H02M 3/07
(Continued)

(56) References Cited

U.S. PATENT DOCUMENTS 4,461,991 A * 7/1984 Smith .................... G05F 3/267
                                                              323/312
4,645,948 A * 2/1987 Morris ................... G05F 3/262
                                                              257/380
(Continued)

FOREIGN PATENT DOCUMENTS

CN    102645950 A    8/2012
EP    0834981 A2    4/1998

OTHER PUBLICATIONS

Ishibashi K., et al., "Circuit Technologies for Reducing the Power of SOC and Issues on Transistor Models," International Electron Devices Meeting, 2006, pp. 1-4.
(Continued)

*Primary Examiner* — Brandon S Cole
(74) *Attorney, Agent, or Firm* — Loza & Loza LLP

(57) ABSTRACT

A feed-forward bias circuit biases body bias terminals of transistors of another circuit to compensate for PVT variations in the other circuit. In some aspects, the feed-forward bias circuit compensates for transistor process corners in a circuit by enabling the generation of different bias signals under different corner conditions. In some implementations, the feed-forward bias circuit is used to bias a delay circuit so that the delay circuit exhibits relatively constant delay characteristics over different PVT conditions.

30 Claims, 16 Drawing Sheets

(51) Int. Cl.
　　　H03K 5/159　　　(2006.01)
　　　H03K 3/011　　　(2006.01)
　　　H03K 17/14　　　(2006.01)
　　　H03K 19/003　　(2006.01)
　　　G05F 3/26　　　　(2006.01)

(52) U.S. Cl.
　　　CPC ........... *H03K 5/159* (2013.01); *H03K 17/145* (2013.01); *H03K 19/00384* (2013.01); *H03K 2217/0018* (2013.01)

(58) Field of Classification Search
　　　USPC .................... 327/530–546; 323/312–317
　　　See application file for complete search history.

(56) References Cited

U.S. PATENT DOCUMENTS

| | | | |
|---|---|---|---|
| 6,107,868 A * | 8/2000 | Diniz ..................... | G05F 3/245 327/512 |
| 6,163,290 A | 12/2000 | Moreland et al. | |
| 6,507,179 B1 * | 1/2003 | Jun ........................ | G05F 3/30 323/313 |
| 6,624,655 B2 | 9/2003 | Mandal et al. | |
| 6,972,624 B1 | 12/2005 | Stroet | |
| 7,030,685 B1 * | 4/2006 | Aram ..................... | G05F 3/262 327/538 |
| 7,557,625 B1 * | 7/2009 | Bazes .................... | H03L 7/0895 327/148 |
| 8,098,083 B2 | 1/2012 | Truong et al. | |
| 8,378,739 B2 * | 2/2013 | Notani .................... | G05F 1/56 327/538 |
| 8,390,356 B2 | 3/2013 | Shinde | |
| 8,604,826 B2 | 12/2013 | Cho et al. | |
| 9,525,973 B2 * | 12/2016 | Racz ...................... | H04W 24/00 |
| 2001/0048319 A1 * | 12/2001 | Miyazaki ........... | H03K 19/00384 326/1 |
| 2008/0007243 A1 * | 1/2008 | Matsumoto ............. | G05F 3/30 323/313 |
| 2009/0058525 A1 | 3/2009 | Damitio et al. | |
| 2012/0195138 A1 * | 8/2012 | Son ........................ | G11C 7/04 365/189.07 |
| 2014/0015611 A1 | 1/2014 | Chung et al. | |
| 2014/0225588 A1 * | 8/2014 | Malinowski ......... | H03K 17/082 323/316 |

OTHER PUBLICATIONS

International Search Report and Written Opinion—PCT/CN2014/078223—ISA/EPO—dated Dec. 31, 2014.

* cited by examiner

FEED-FORWARD BIAS CIRCUIT

TECHNICAL FIELD

The following relates generally to electrical circuits and, more specifically, but not exclusively, to a feed-forward bias circuit.

BACKGROUND

Some electronic applications employ delay circuits or circuitry where it is desirable to have consistent signal delays. For example, in a communication device, a delay circuit can be used to compensate for large timing skews imparted on a signal as a result of the signal passing through a communication channel and front-end analog circuits. In general, higher performance can be achieved if the delay imparted on a signal remains relatively constant in spite of variations in process, voltage, and temperature (PVT) that may otherwise affect the operation of the circuit. In some of these applications, it is also desirable for the circuitry to have fast turn-on and turn-off times and low overhead (e.g., in terms of latency and power consumption). For example, in a high speed serial communication circuit that employs burst mode, the circuit may be turned-on during a communication burst and turned-off otherwise. In view of the above, it is desirable for some applications for circuits such a delay circuits to have (1) a high tolerance to PVT variations, (2) low power consumption, and (3) a fast turn-on time.

FIG. 1 illustrates a conventional delay circuit 100 that employs fixed tail bias currents IB1 and IB2 for PVT compensation. Here, a differential input signal IN_P and IN_N drives a first transistor pair 102, resulting in a delayed differential output signal OUT_P and OUT_N generated by a second transistor pair 104. However, the delay circuit 100 is not a true digital logic cell since the input and output signals do not swing from rail-to-rail due to the current sources 106 and the load resistors 108. Moreover, the on-chip current sources 106 are calibrated whenever the delay circuit 100 is powered-on. The resulting calibration time for the current sources 106 increases the overhead associated with the delay circuit 100.

FIG. 2 illustrates another conventional delay circuit 200 that employs a feedback loop 202 for PVT compensation. The feedback loop 202 controls direct current (DC) voltage levels at back-gates, also known as body bias terminals (e.g., body bias terminals 204), of pairs of NMOS and PMOS transistors (e.g., transistors 206) to adjust the delay imparted on an input clock CLK_REF by the NMOS and PMOS transistors. In the delay circuit 200, a comparator 208 compares the input clock CLK_REF with the output (delayed) clock OUT and generates a signal that is proportional to the delay. Based on this signal, a decoder 210 and bias generators 212 cooperate to generate bias voltages Vbp and Vbn that are fed back to the body bias terminals 204 of the NMOS and PMOS transistors. In practice, however, the feedback loop 202 has a limited bandwidth. Consequently, the delay circuit 200 has a relatively a long turn-on time and turn-off time. In addition, the feedback circuit has relatively high power consumption due to the use of the comparator 208, the decoder 210, and the bias generators 212.

Other types of conventional delay circuits employ on-chip delay calibration such as system calibration. However, system level calibration is generally calibrated for a particular corner, temperature, and voltage (e.g., Vdd) condition. Moreover, these delay circuits are calibrated every time the delay circuit is turned-on. Consequently, these types of delay circuits do not provide sufficiently fast turn-on and turn-off times (e.g., sufficient for high speed burst mode communication) and have relatively high overhead. Consequently, there is a need for improved PVT compensation for delay circuits and other types of circuits.

BRIEF SUMMARY OF SOME EXAMPLES

The following summarizes some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a summary form as a prelude to the more detailed description that is presented later.

Various aspects of the disclosure provide for a feed-forward bias circuit that biases the body bias terminals of transistors of another circuit to compensate for PVT variations. For example, the feed-forward bias circuit can be used to bias a delay circuit such that the delay circuit exhibits relatively constant delay characteristics over different PVT conditions. In some aspects, the feed-forward bias circuit compensates for transistor process corners in a circuit by generating different bias signals under different corner conditions.

In some aspects, the feed-forward bias circuit includes a low-dropoff (LDO) regulator, first and second current mirror circuits, and a voltage follower circuit. The LDO regulator provides a steady supply voltage that is provided to the first current mirror circuit. The voltage follower circuit couples the first current mirror circuit to a second current mirror circuit, such that the first and second current mirror circuits provide bias signals Vbp and Vbn for body bias terminals of transistors of a delay circuit or some other type of circuit.

Further aspects of the disclosure provide an apparatus comprising a first current mirror circuit to generate a first bias signal based on a first current signal; a voltage follower circuit electrically coupled the first current mirror circuit to generate a first voltage based on the first bias signal; and a second current mirror circuit, electrically coupled to the voltage follower circuit, to generate a second bias signal based on the first voltage.

Still further aspects of the disclosure provide a method for generating a first feed-forward bias signal based on a first current signal; generating a first voltage based on the first feed-forward bias signal; and generating a second feed-forward bias signal based on the first voltage.

Additional aspects of the disclosure provide an apparatus comprising means for generating a first feed-forward bias signal based on a first current signal; means for generating a first voltage based on the first feed-forward bias signal; and means for generating a second feed-forward bias signal based on the first voltage.

Examples of other aspects of the disclosure related to the above apparatuses and method follow. In some aspects, the apparatus further comprises: a first transistor comprising a first body bias terminal electrically coupled to the first current mirror circuit to receive the first bias signal; and a second transistor electrically coupled to the first transistor and comprising a second body bias terminal electrically coupled to the second current mirror circuit to receive the second bias signal. In some aspects, the first transistor is a p-channel transistor and comprises a first drain terminal; and the second transistor is an n-channel transistor and comprises a second drain terminal electrically coupled to the first drain terminal.

In some aspects, the first and second current mirror circuits are configured to adjust the first and second bias signals in response to at least one of a variation in temperature at the apparatus or a variation in voltage at the apparatus. In some aspects, the first and second current mirror circuits are configured to generate the first and second bias signals at different levels for different process corners. In some aspects, the first current mirror circuit has a transfer ratio of at least 2:1; and the second current mirror circuit has a transfer ratio of at least 3:1. In some aspects, the apparatus further comprises a low-dropoff regulator electrically coupled to the first current mirror circuit to provide a supply voltage to the first current mirror circuit. In some aspects, the apparatus further comprises a delay circuit embodying the first transistor and the second transistor.

In some aspects, the voltage follower circuit comprises a first transistor to provide the first voltage. In some aspects, the first current mirror circuit comprises: a second transistor to provide the first current signal to the first transistor; and a third transistor electrically coupled to the second transistor to provide the first bias signal to the first transistor. In some aspects, the second current mirror circuit comprises: a fourth transistor to receive the first voltage from the first transistor; and a fifth transistor electrically coupled to the fourth transistor to provide the second bias signal.

Further aspects of the disclosure provide an apparatus comprising a feed-forward bias signal generator to generate a plurality of bias signals; and a circuit comprising a plurality of transistors, each of the transistors comprising a body bias terminal electrically coupled to the feed-forward bias signal generator to receive a respective one of the bias signals.

Still further aspects of the disclosure provide a method for generating a plurality of feed-forward bias signals; and adjusting a plurality of body biases of a plurality of transistors based on the feed-forward bias signals.

Additional aspects of the disclosure provide an apparatus comprising means for generating a plurality of feed-forward bias signals; and means for adjusting a plurality of body biases of a plurality of transistors based on the feed-forward bias signals.

Examples of other aspects of the disclosure related to the above apparatuses and method follow. In some aspects, the bias signals comprise a first bias signal and a second bias signal; the transistors comprise a first transistor and a second transistor; the first transistor is a p-channel transistor and comprises a first body bias terminal to receive the first bias signal; and the second transistor is an n-channel transistor and comprises a second body bias terminal to receive the second bias signal. In some aspects, the circuit is a delay circuit configured to delay an input signal based on the bias signals. In some aspects, the feed-forward bias signal generator comprises current mirror circuitry to generate the bias signals. In some aspects, the feed-forward bias signal generator comprises: a first current mirror circuit to generate a first one of the bias signals; and a second current mirror circuit to generate a second one of the bias signals. In some aspects, the feed-forward bias signal generator further comprises a voltage follower circuit to electrically couple the first current mirror circuit to the second current mirror circuit. In some aspects, the apparatus is a transceiver.

Further aspects of the disclosure provide an apparatus comprising a first pair of gate-coupled transistors to generate a first bias signal based on a first current signal; a first transistor electrically coupled the first pair of gate-coupled transistors to generate a first voltage based on the first bias signal; and a second pair of gate-coupled transistors, electrically coupled to the first transistor, to generate a second bias signal based on the first voltage.

Examples of other aspects of the disclosure related to the above apparatus follow. In some aspects, the first pair of gate-coupled transistors comprises: a second transistor comprising a first drain terminal to provide the first current signal; and a third transistor comprising a second drain terminal to provide the first bias signal. In some aspects, the second pair of gate-coupled transistors comprises a fourth transistor comprising a first gate terminal electrically coupled to the first transistor to receive the first voltage; the second pair of gate-coupled transistors comprises a fifth transistor comprising a second gate terminal electrically coupled to the first gate terminal; and the fifth transistor comprises a third drain terminal to provide the second bias signal.

In some aspects, the first transistor comprises: a first drain terminal electrically coupled to the first pair of gate-coupled transistors to receive the first current signal; a first gate terminal electrically coupled to the first pair of gate-coupled transistors to receive the first bias signal; and a first source terminal electrically coupled to the second pair of gate-coupled transistors to provide the first voltage signal.

In some aspects, the first pair of gate-coupled transistors comprises a second transistor and a third transistor; the second transistor comprises a second gate terminal, a second source terminal, and a second drain terminal; and the third transistor comprises a third gate terminal, a third source terminal, and a third drain terminal; the second source terminal and the third source termination are electrically coupled to a supply voltage source; the second gate terminal is electrically coupled to the third gate terminal and the second drain terminal; the second drain terminal is electrically coupled to the first drain terminal to provide the first current signal to the first transistor; and the third drain terminal is electrically coupled to the first gate terminal to provide the first bias signal to the first transistor.

In some aspects, the second pair of gate-coupled transistors comprises a second transistor and a third transistor; the second transistor comprises a second gate terminal, a second source terminal, and a second drain terminal; and the third transistor comprises a third gate terminal, a third source terminal, and a third drain terminal; the second source terminal and the third source termination are electrically coupled; the second gate terminal is electrically coupled to the third gate terminal and the second drain terminal; the first source terminal is electrically coupled to the second drain terminal to provide the first voltage to the second transistor; and the third drain terminal is coupled to a fourth transistor to provide the second bias signal.

These and other aspects of the disclosure will become more fully understood upon a review of the detailed description, which follows. Other aspects, features, and implementations of the disclosure will become apparent to those of ordinary skill in the art, upon reviewing the following description of specific, exemplary implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while exemplary implementations may be discussed below as device, system, or method implementations it should be understood that such exemplary implementations can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
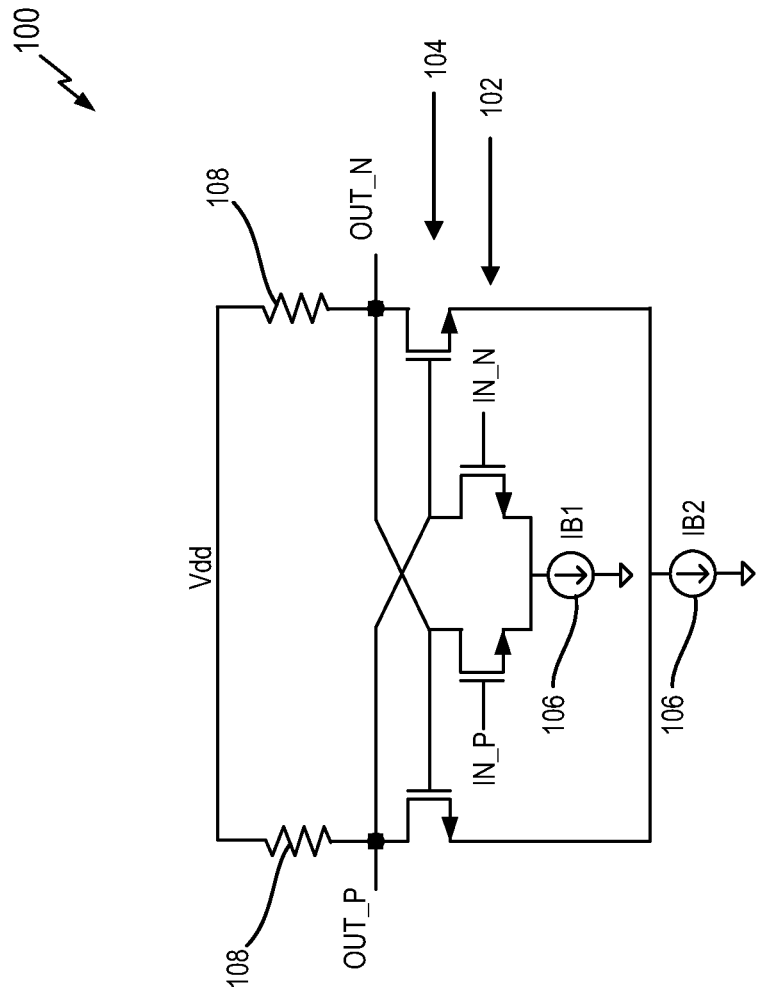
FIG. 1 is a circuit diagram illustrating an example of a conventional delay circuit.
Figure 2:
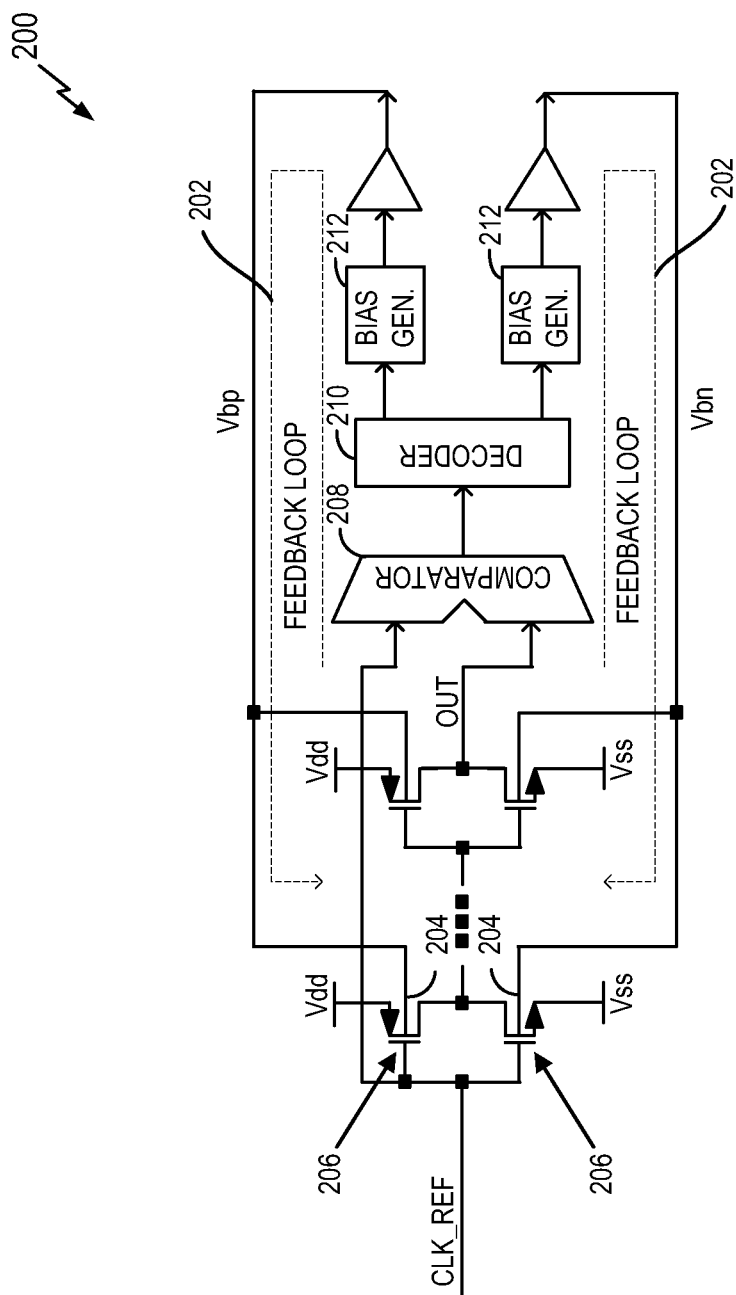
FIG. 2 is a circuit diagram illustrating another example of a conventional delay circuit.
Figure 3:
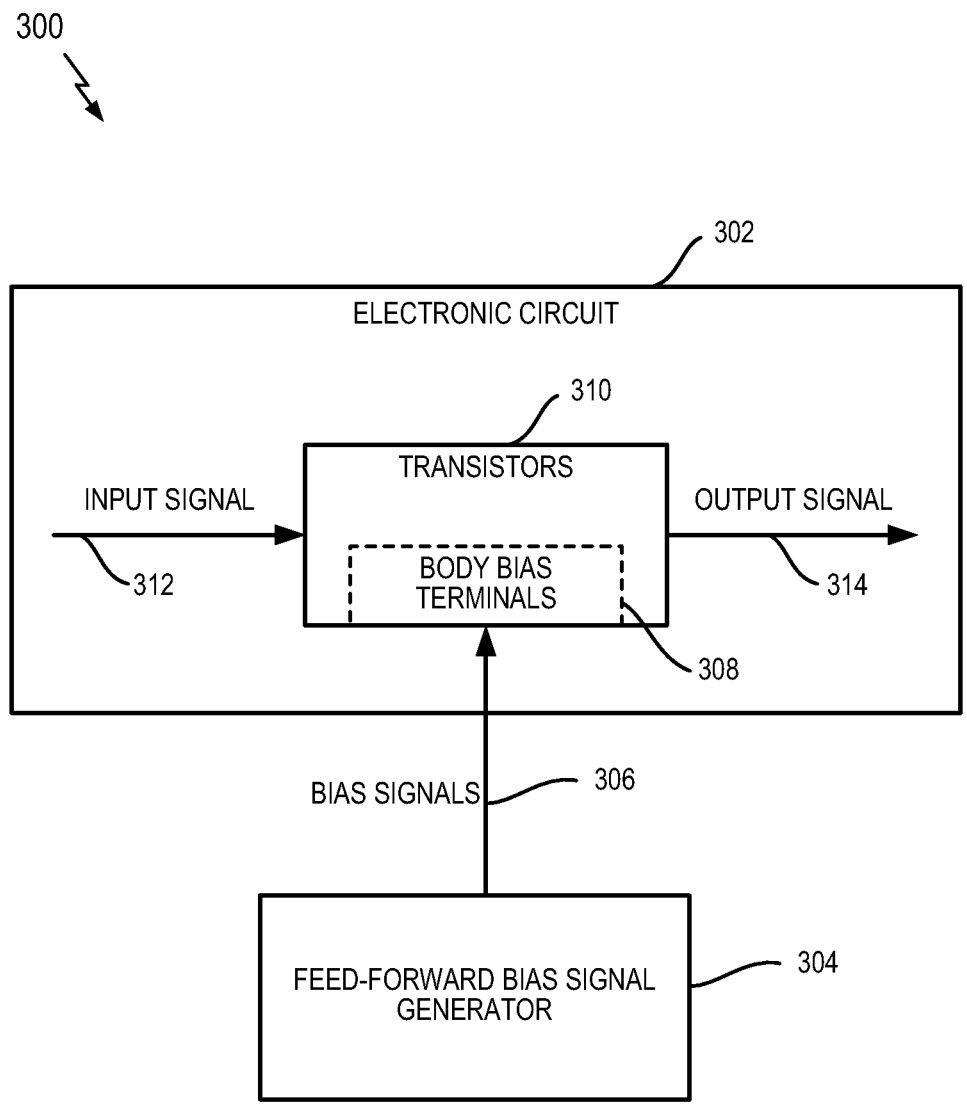
FIG. 3 is a block diagram illustrating an example of a feed-forward bias compensation circuit in accordance with some aspects of the disclosure.

FIG. 3 illustrates, in a simplified manner, a circuit 300 employing feed-forward bias compensation to compensate for variations in PVT in an electronic circuit 302. A feed-forward bias signal generator 304 generates bias signals 306 that control body bias terminals 308 of transistors 310 of the electronic circuit 302.

In the event the circuit 300 is subjected to PVT variations due to the manufacturing process or due to operating conditions, during operation the feed-forward bias signal generator 304 generates the bias signals 306 in such a way to mitigate the effect of the PVT variations on the operation of the transistors 310. For example, the transistors 310 will impart a delay on an input signal 312 whereby by a corresponding output signal 314 will be delayed in time relative to the input signal 312. If different physical implementations of the transistors 310 are subjected to different process variations (e.g., different semiconductor doping concentrations) during manufacture, the different physical implementations of the transistors 310 may have different delay characteristics. Similarly, if a given physical implementation of the transistors 310 is subjected to different temperatures and/or different supply voltages over a period of time, the transistors 310 may have different delay characteristics over that period of time.

The electronic circuit 302 and the feed-forward bias signal generator 304 are manufactured together (e.g., on the same integrated circuit die), and are subjected to the same temperature and voltage operating conditions. Accordingly, the feed-forward bias signal generator 304 is subjected to the same PVT variations as the transistors 310. In the event there are PVT variations that would normally cause an increase in the delay imparted by the transistors 310 (e.g., a delay cell 310), the feed-forward bias signal generator 304 generates the bias signals 306 in a manner that reduces this delay. Conversely, in the event there are PVT variations that would normally cause a decrease in the delay imparted by the transistors (delay cell) 310, the feed-forward bias signal generator 304 generates the bias signals 306 in a manner that increases this delay. Consequently, the delay imparted by the transistors (delay cell) 310 is maintained relatively constant through the use of the feed-forward bias signals 306.

Advantageously, the circuit 300 does not employ a feedback loop for the PVT compensation. Accordingly, the circuit 300 is PVT compensated but does not suffer from the relatively slow turn-on and turn-off times and relatively high power consumption associated with a feedback loop. Moreover, as discussed in more detail below, the feed-forward bias signal generator 304 can be implemented in a manner that consumes very low power during operation. Consequently, the feed-forward bias signal generator 304 can simply remain powered-on even if it is used to bias a circuit that is powered-on and powered-off. Moreover, the delay cell 310 generates signals at true digital logic levels. Accordingly, the delay cell 310 can be used in digital logic implementations, unlike some conventional PVT compensation circuits. Furthermore, the feed-forward bias signal generator 304 does not use calibration to ensure that the appropriate bias signals are generated. Accordingly, the feed-forward bias signal generator 304 can accurately track variations in PVT, without the latency, power consumption, and signaling problems associated with conventional designs.

Figure 4:
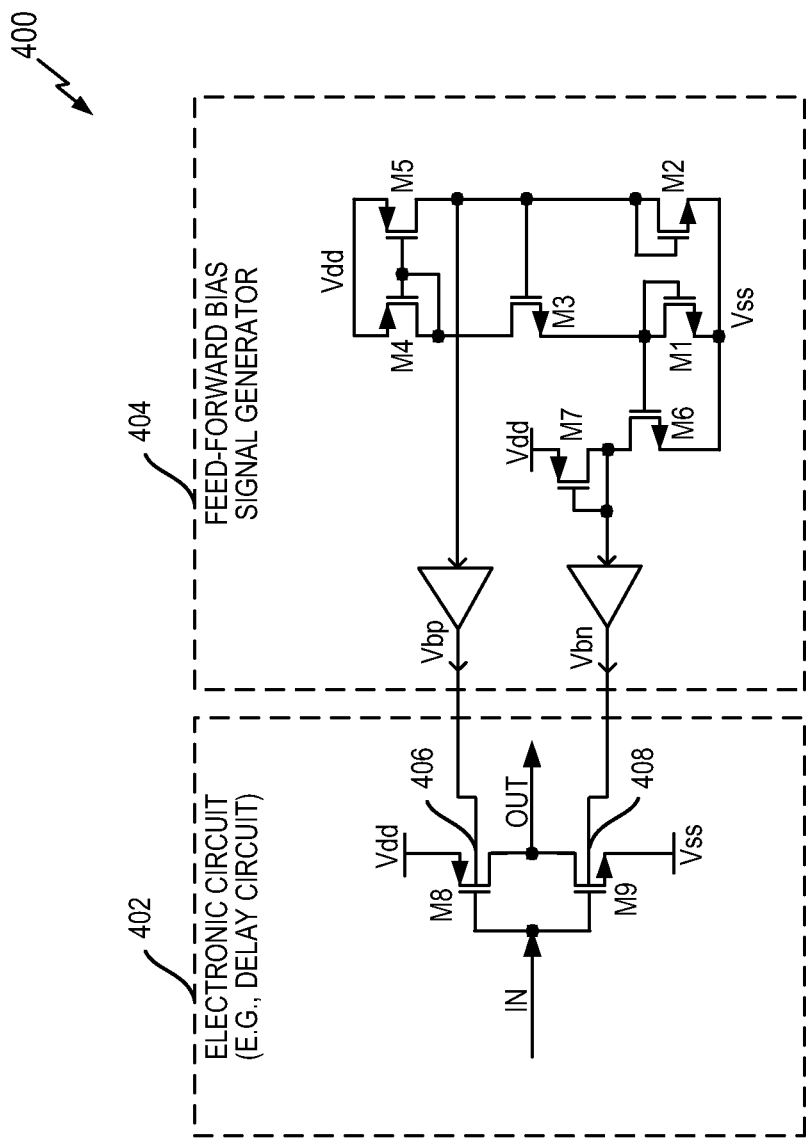
FIG. 4 is a circuit diagram illustrating an example of a feed-forward bias compensation circuit in accordance with some aspects of the disclosure.

FIG. 4 illustrates, at a circuit level, an example of a circuit 400 employing feed-forward bias compensation to compensate for variations in PVT in an electronic circuit 402. The electronic circuit 402 is an example of the electronic circuit 302 of FIG. 3. Similarly, the feed-forward bias signal generator 404 is an example of the feed-forward bias signal generator 304 of FIG. 3.

In the example of FIG. 4, the feed-forward bias signal generator 404 generates a first bias signal Vbp and a second bias signal Vbn. Of note, the feed-forward bias signal generator 404 generates the first and second bias signals Vbp and Vbn without the use of a feedback loop to the electronic circuit 402.

The electronic circuit 402 includes a first transistor M8 and a second transistor M9 in this simplified example. The first and second transistors M8 and M9 form a delay cell that delays an input signal IN to provide a delayed output signal OUT. As discussed below, a circuit such as the electronic circuit 402 may include additional transistors in other implementations (e.g., to provide additional delay cells).

The first and second bias signals Vbp and Vbn control the delay imparted by the first and second transistors M8 and M9 on the input signal IN. To this end, the first bias signal Vbp is coupled to a first body bias terminal 406 of the first transistor M8, while the second bias signal Vbn is coupled to a second body bias terminal 408 of the second transistor M9.

Since the first transistor M8 is a p-channel (PMOS) device, an increase in the value of the first bias signal Vbp (e.g., a value closer to the positive supply voltage Vdd) increases the delay imparted by the first transistor M8 on the input signal IN. For example, in the presence of a higher body bias voltage, a larger threshold voltage Vth may be needed at the gate of the first transistor M8 to turn-on the first transistor M8. Thus, the first transistor M8 will not turn-on as fast if there is a higher bias body voltage as compared to the case whether the bias body voltage is lower.

Conversely, a decrease in the value of the first bias signal Vbp (e.g., a value closer to the negative supply voltage or ground Vss) decreases the delay imparted by the first transistor M8 on the input signal IN. For example, in the presence of a lower body bias voltage, a smaller threshold voltage Vth may be needed at the gate of the first transistor M8 to turn-on the first transistor M8. Thus, the first transistor M8 will turn-on faster if there is a lower bias body voltage as compared to the case whether the bias body voltage is higher.

Since the second transistor M9 is an n-channel (NMOS) device, an increase in the value of the second bias signal Vbn (e.g., a value closer to the positive supply voltage Vdd) decreases the delay imparted by the second transistor M9 on the input signal IN. For example, in the presence of a higher body bias voltage, a smaller threshold voltage Vth may be needed at the gate of the second transistor M9 to turn-on the second transistor M9. Thus, the second transistor M9 will turn-on faster if there is a higher bias body voltage as compared to the case whether the bias body voltage is lower.

Conversely, a decrease in the value of the second bias signal Vbn (e.g., a value closer to the negative supply voltage or ground Vss) increases the delay imparted by the second transistor M9 on the input signal IN. For example, in the presence of a lower body bias voltage, a larger threshold voltage Vth may be needed at the gate of the second transistor M9 to turn-on the second transistor M9. Thus, the second transistor M9 will not turn-on as fast if there is a lower bias body voltage as compared to the case whether the bias body voltage is higher.

Table 1 illustrates an example of bias signal values generated by the feed-forward bias signal generator 404 under the five standard corner conditions. The corners relate to typical (T) mobility (for electrons or holes), fast (F) mobility, and slow (S) mobility. Typically, the different mobilities are due to process variations that result in different doping concentrations for different dies. For CMOS circuits, the corners are considered with respect to both the p-channel device (PMOS) and the n-channel device (NMOS). In the five standard corner conditions TT, SS, FF, SF, and FS, the first letter corresponds to the n-channel device and the second letter corresponds to the p-channel device. Thus, SF corresponds to slow mobility for the n-channel device and fast mobility for the p-channel device, while FS corresponds to fast mobility for the n-channel device and slow mobility for the p-channel device.

TABLE 1

|  | TT | SS | FF | SF | FS |
|---|---|---|---|---|---|
| Conventional delay cell | 22.64 ps | 30.3 ps | 17.5 ps | 23.1 ps | 22.7 ps |
| Delay cell with PVT tracking | 20.6 ps (Vbp = 0.7 V) (Vbn = 0.5 V) | 20.8 ps (Vbp = 0.3 V) (Vbn = 0.7 V) | 20.0 ps (Vbp = 1.5 V) (Vbn = 0.1 V) | 20.7 ps (Vbp = 0.6 V) (Vbn = 0.4 V) | 20.9 ps (Vbp = 0.7 V) (Vbn = 0.3 V) |

As indicated in Table 1, for the typical corner TT, the first bias signal Vbp is set to 0.7 V and the second bias signal Vbn is set to 0.5 V in this example. For the SS corner, the first bias signal Vbp is lowered to 0.3 V from the typical case and the second bias signal Vbn is raised to 0.7 V from the typical case to decrease the delay of both the first and second transistors M8 and M9 (the delay cell in the example of FIG. 4). For the FF corner, the first bias signal Vbp is raised to 1.5 V from the typical case and the second bias signal Vbn is lowered to 0.1 V from the typical case to increase the delay of both the first and second transistors M8 and M9. For the SF corner, the first bias signal Vbp is lowered to 0.6 V from the typical case and the second bias signal Vbn is lowered to 0.4 V from the typical case to increase the delay of the first transistor M8 and decrease the delay of the second transistor M9. For the FS corner, the first bias signal Vbp is maintained at 0.7 V as in the typical case and the second bias signal Vbn is lowered to 0.3 V from the typical case to decrease the delay of the first transistor M8 and increase the delay of the second transistor M9.

Table 1 also illustrates simulated delays for a conventional delay cell with no PVT tracking and a delay cell that uses PVT tracking in accordance with the teachings herein. Here, it may be seen that the conventional delay cell has a delay variation on the order of 30% relative to TT. In contrast, the delay cell with PVT tracking has a delay variation on the order of 3% relative to TT.

Figure 5:
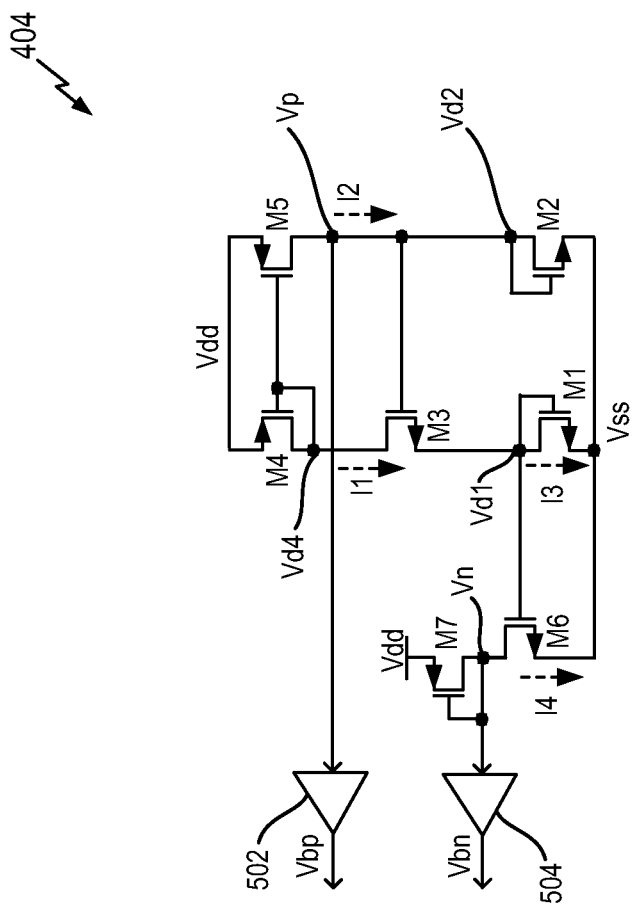
FIG. 5 is a circuit diagram illustrating an example of a feed-forward bias signal generator in accordance with some aspects of the disclosure.

The operation of the feed-forward bias signal generator 404 will be described in conjunction with FIG. 5. The feed-forward bias signal generator 404 include a first transistor M1, a second transistor M2, a third transistor M3, a fourth transistor M4, a fifth transistor M5, a sixth transistor M6, and a seventh transistor M7. The second and seventh transistors M2 and M7 are configured as resistors. A voltage Vp at the drain of the fifth transistor M5 is buffered by a buffer 502 to provide the first bias signal Vbp. A voltage Vn at the drain of the sixth transistor M6 is buffered by a buffer 504 to provide the second bias signal Vbn.

As discussed above, the feed-forward bias signal generator 404 generates the first and second bias signals Vbp and Vbn in a manner that is sensitive to the five MOSFET corners TT, SS, FF, SF, and FS.

For example, at the slow corner (SS), the threshold voltage (Vth) for all of the transistors M1-M7 is higher and the transconductance (gm) for all of the transistors M1-M7 is lower as compared to the typical corner (TT). Consequently, the current I1 in the bias core is very small (e.g., less than 100 nA) in this case. The third transistor M3 also forces the core current I1 to be low under this condition since the third transistor M3 couples the low voltage level at voltage Vd2 to the voltage Vd1. Hence, as compared to the typical corner, a lower first bias signal Vbp is generated due to the low current I2 through the resistance of the second transistor M2. The low voltage level at Vp is coupled via the third transistor M3 to Vd1. Thus, the current I4 will also be low given the low Vd1 at the gate of the sixth transistor M6. Hence, as compared to the typical corner, a higher second bias signal Vbn is generated at the slow corner due to the low current I4 through the resistance of the seventh transistor M7.

At the fast corner (FF), the threshold voltage (Vth) for all of the transistors M1-M7 is lower and the transconductance (gm) for all of the transistors M1-M7 is higher as compared to the typical corner. Consequently, the bias core current I1 is higher (e.g., on the order of 5 uA-15 uA) due to a relatively high voltage being applied to the relative small resistance of the first transistor M1 in this case. Therefore, as compared to the typical corner, a higher first bias signal Vbp is generated due to the higher current I2 through the resistance of the second transistor M2. The high voltage level at Vp is coupled via the third transistor M3 to Vd1. Thus, the current I4 will also be higher given the high level of the voltage Vd1 at the gate of the sixth transistor M6. Hence, as compared to the typical corner, a lower second bias signal Vbn is generated at the fast corner due to the higher current I4 through the resistance of the seventh transistor M7.

Figure 6:
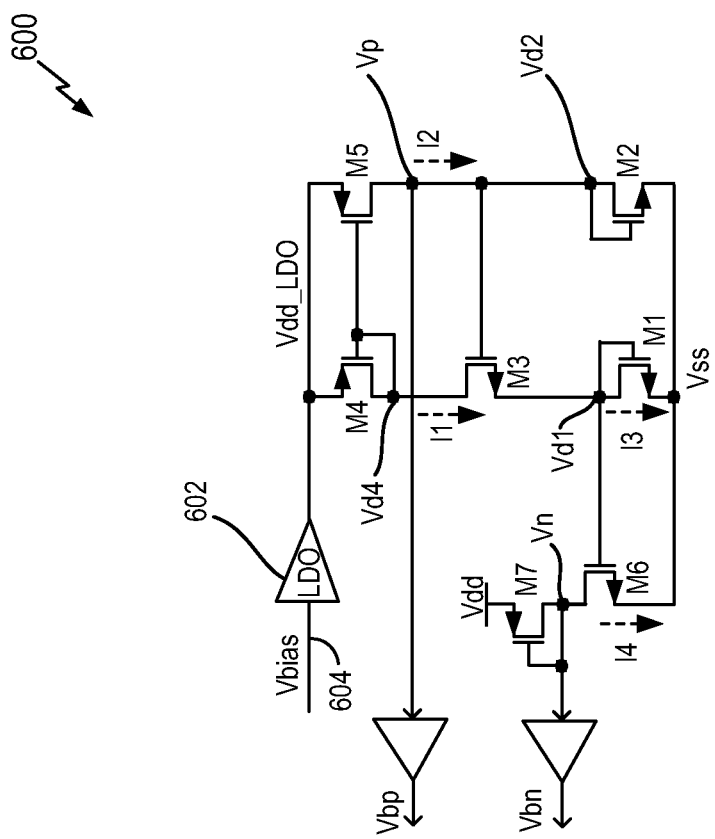
FIG. 6 is a circuit diagram illustrating an example of a feed-forward bias signal generator that includes a low-dropoff regulator in accordance with some aspects of the disclosure.

Referring now to FIG. 6, in some implementations, a feed-forward bias signal generator 600 includes a low-dropoff (LDO) voltage regulator 602. For example, the supply voltage Vdd (FIG. 5) can vary more that 15% in some scenarios. Since, the bias core (e.g., including the first through fifth transistors M1-M5) is sensitive to a variation in supply voltage, the LDO voltage regulator 602 is used to reduce power-supply variation for the bias core.

The LDO voltage regulator 602 is controlled by a bias signal Vbias 604. For example, the bias signal Vbias 604 may be set by a relatively precise voltage source. The LDO voltage regulator 602 generates a regulated positive supply voltage Vdd_LDO at a certain level based on the level of the bias signal Vbias 604. The LDO voltage regulator 602 has a relatively high input impedance and a relatively low output impedance. In this way, the LDO voltage regulator 602 may supply the supply voltage Vdd_LDO at a relatively constant voltage level irrespective of changes in the current draw of the feed-forward bias signal generator 600 (e.g., currents I1 and I2) under different corner conditions. In some implementations, the LDO voltage regulator 602 employs an operational amplifier (OP amp) for supplying the supply voltage Vdd_LDO.

Figure 7:
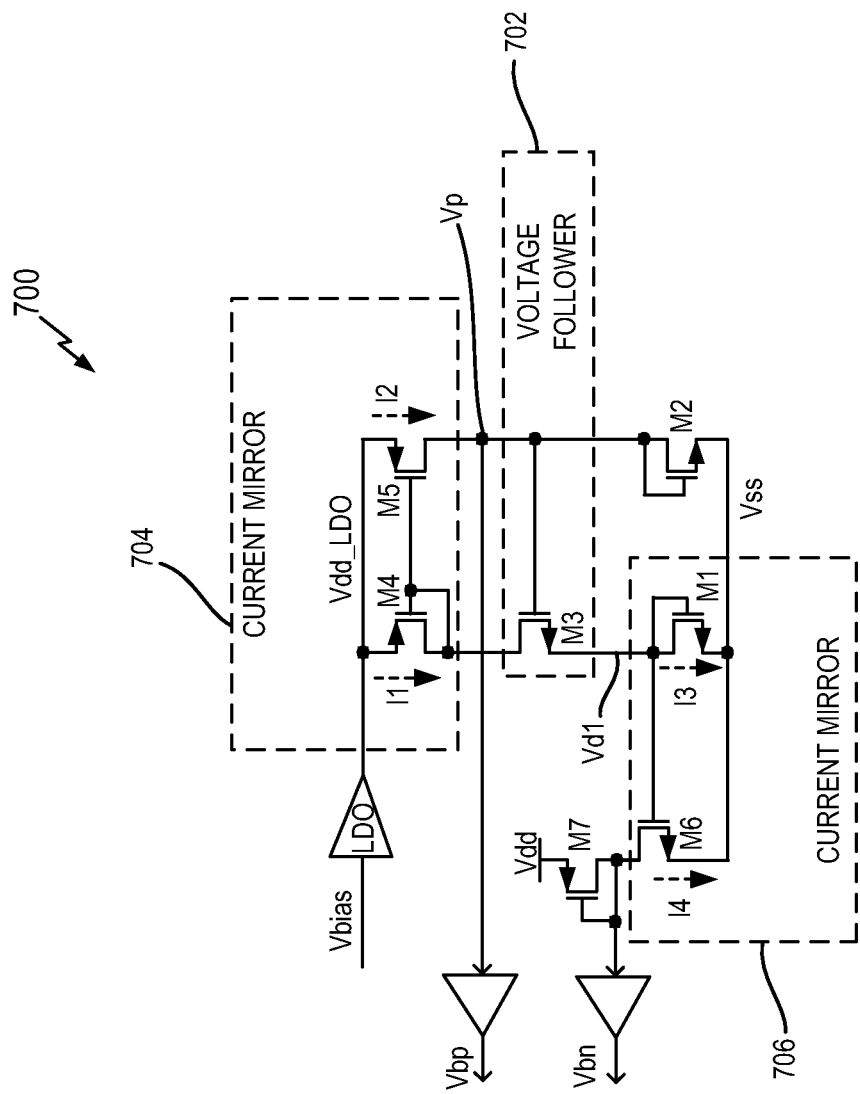
FIG. 7 is a circuit diagram illustrating functional blocks in an example of a feed-forward bias signal generator in accordance with some aspects of the disclosure.

FIG. 7 illustrates several functional blocks of a feed-forward bias signal generator 700 constructed in accordance with the teaching herein. As indicated by a first dashed block 702, the third transistor M3 functions as a voltage follower. That is, the third transistor M3 ensures that the voltage Vd1 closely follows the voltage Vp. Thus, the third transistor M3 helps to maintain the first and second bias signals Vbp and Vbn.

As indicated by a second dashed block 704, the fourth and fifth transistors M4 and M5 are in a current mirror configuration. Thus, the current I2 through the fifth transistor M5 is based on the current I1 through the fourth transistor M4. That is, the magnitude of the current I2 depends on the magnitude of the current I1 and the transfer ratio (current gain) of the current mirror of block 704. In some implementations, the transfer ratio of the current mirror of block 704 is greater than 2 (e.g., 3) to ensure that the voltage Vp is sufficiently high during fast corner conditions.

As indicated by a third dashed block 706, the first and sixth transistors M1 and M6 are in a current mirror configuration. The current I4 through the sixth transistor M6 is based on the current I3 through the first transistor M1. The magnitude of the current I4 thus depends on the magnitude of the current I3 and the transfer ratio of the current mirror of block 706. In some implementations, the transfer ratio of the current mirror of block 706 is greater than 3 (e.g., 4) to ensure that the voltage Vn is sufficiently high during slow corner conditions.

Figure 8:
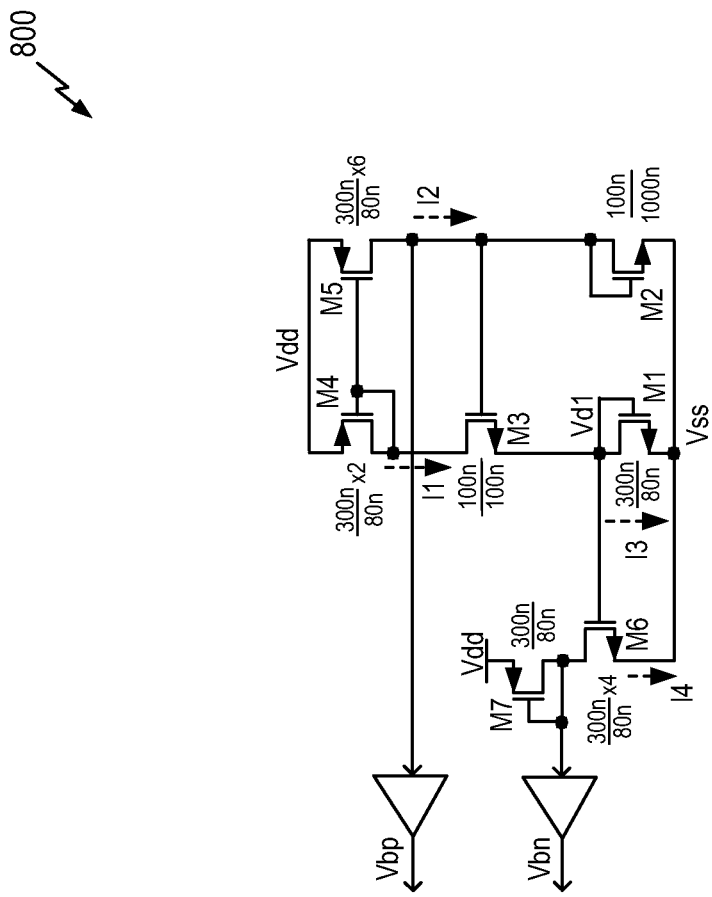
FIG. 8 is a circuit diagram illustrating current ratios in an example of a feed-forward bias signal generator in accordance with some aspects of the disclosure.

FIG. 8 illustrates an example of transistor sizing in a feed-forward bias signal generator 800. The transistors of the feed-forward bias signal generator 800 are sized to provide desired transfer ratios for the current mirrors and desired resistance values for the second and seventh transistors M2 and M7. Transistors are sized in term of the width of the channel over the length of the channel. Hence, a size of 100n/100n (i.e., 100 nanometers over 100 nanometers) indicates that the length and width of the channel are equal. In general, a wider transistor (i.e., one with a larger relative width) conducts more current for a given drain to source voltage (Vds).

As indicated in FIG. 8, the fifth transistor M5 is three times wider than the fourth transistor M4. Thus, the current mirror formed by the fourth and fifth transistors M4 and M5 has a transfer ratio of 3:1. Consequently, the current I2 will be approximately three times larger than the current I1.

The sixth transistor M6 is four times wider than the first transistor M1. Thus, the current mirror formed by the first and sixth transistors M1 and M6 has a transfer ratio of 4:1. Consequently, the current I4 will be approximately four times larger than the current I3.

The second transistor M2 has a very narrow channel (width=1/10 the length). Consequently, the second transistor M2 has a very resistance (e.g., greater than 100 kΩ). In contrast, the seventh transistor M7 has a wider channel (width=30/8 times the length). Thus, the seventh transistor M7 has a much lower resistance than the second transistor M2.

Figure 9:
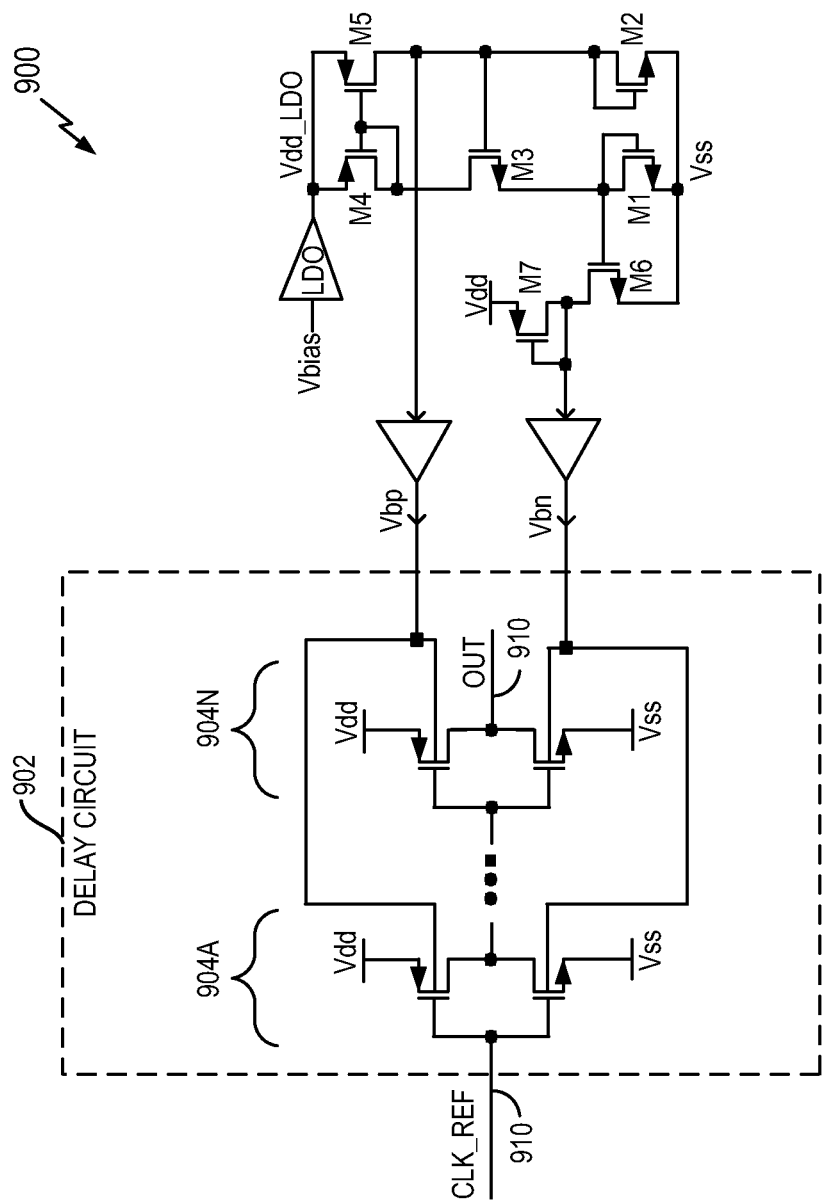
FIG. 9 is a circuit diagram illustrating an example of a feed-forward compensation circuit including an n-stage delay circuit in accordance with some aspects of the disclosure.

As mentioned above, some types of delay circuits include multiple delay cells. FIG. 9 illustrates a feed-forward compensation circuit 900 including an n-stage delay circuit 902. For example, the delay circuit 902 may provide a programmable delay by selectively using one or more of the delay cells. Here, a delay cell includes a PMOS and NMOS transistor pair. Thus, the delay circuit 902 includes a first delay cell 904A up to an n-th delay cell 904N.

As indicated in FIG. 9, the bias signals drive the body bias terminals of all of the delay cell transistors. Specifically, the first bias signal Vbp drives the body bias terminal of each PMOS transistor, while the second bias signal Vbn drives the body bias terminal of each NMOS transistor. Accordingly, all of the delay cells of the delay circuit are compensated for variations in PVT.

Figure 10:
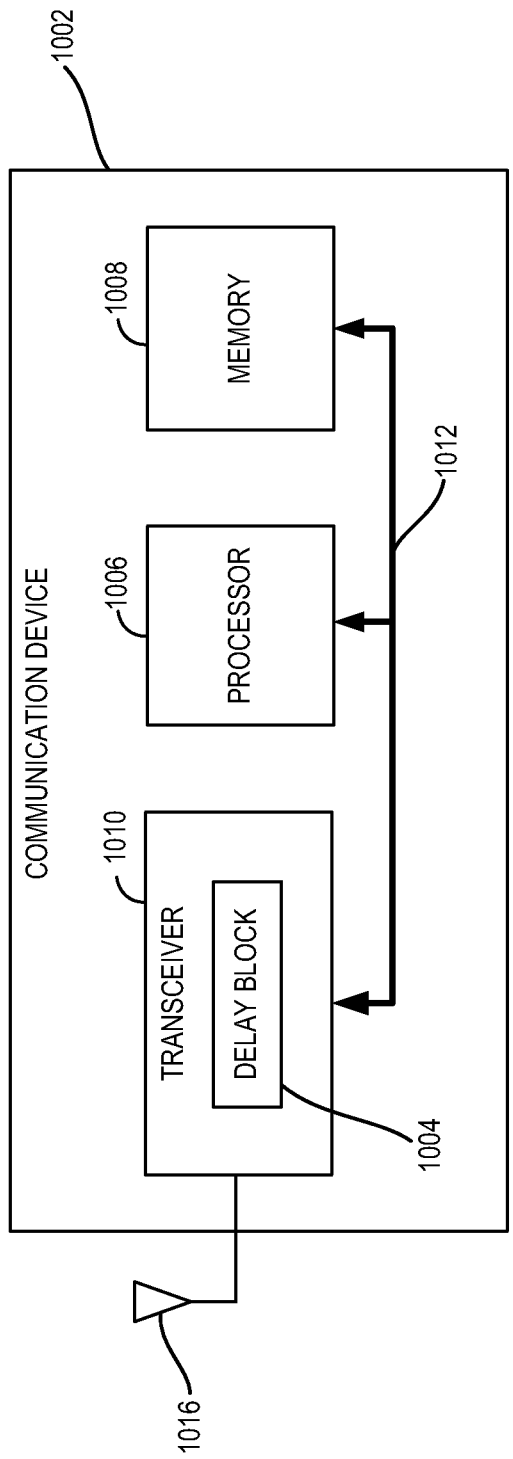
FIG. 10 is a block diagram illustrating an example of a communication device that employs a delay block in accordance with some aspects of the disclosure.

Feed-forward bias compensation as taught herein may be employed in a variety of electronic circuits and applications. FIG. 10 illustrates an example where a communication device 1002 incorporates a delay block 1004 that includes such feed-forward bias compensation. The communication device 1002 includes a processor 1006, a memory 1008, and a transceiver 1010 that are coupled via a signaling bus 1012. The transceiver 1010 transmits and receives radio frequency (RF) signals via at least one antenna 1016. For example, in some implementations, the transceiver 1010 is an n-phase transceiver that is used for high speed mobile data communications. Accordingly, signals processed by the transceiver 1010 may be subjected to large skews from the RF channel and/or from front-end analog circuitry of the transceiver 1010.

By incorporating feed-forward bias compensation as taught herein into the delay block 1004, very precise delays can be imparted on these signals (e.g., to acquire timing) even in the face of PVT variation. Thus, in the event temperature or supply voltage changes over time, the delay block 1004 can impart consistent delays on signals input to the delay block 1004.

Again, it is noted that process variations are manifested as different delays in different delay blocks (e.g., in different integrated circuits). The teachings herein enable a single circuit design to be used to automatically compensate for process variation such that the different delay blocks will provide comparable delays even though the circuits may operate at different corner (or non-corner) conditions as a result of the variation in the manufacturing process.

Figure 11:
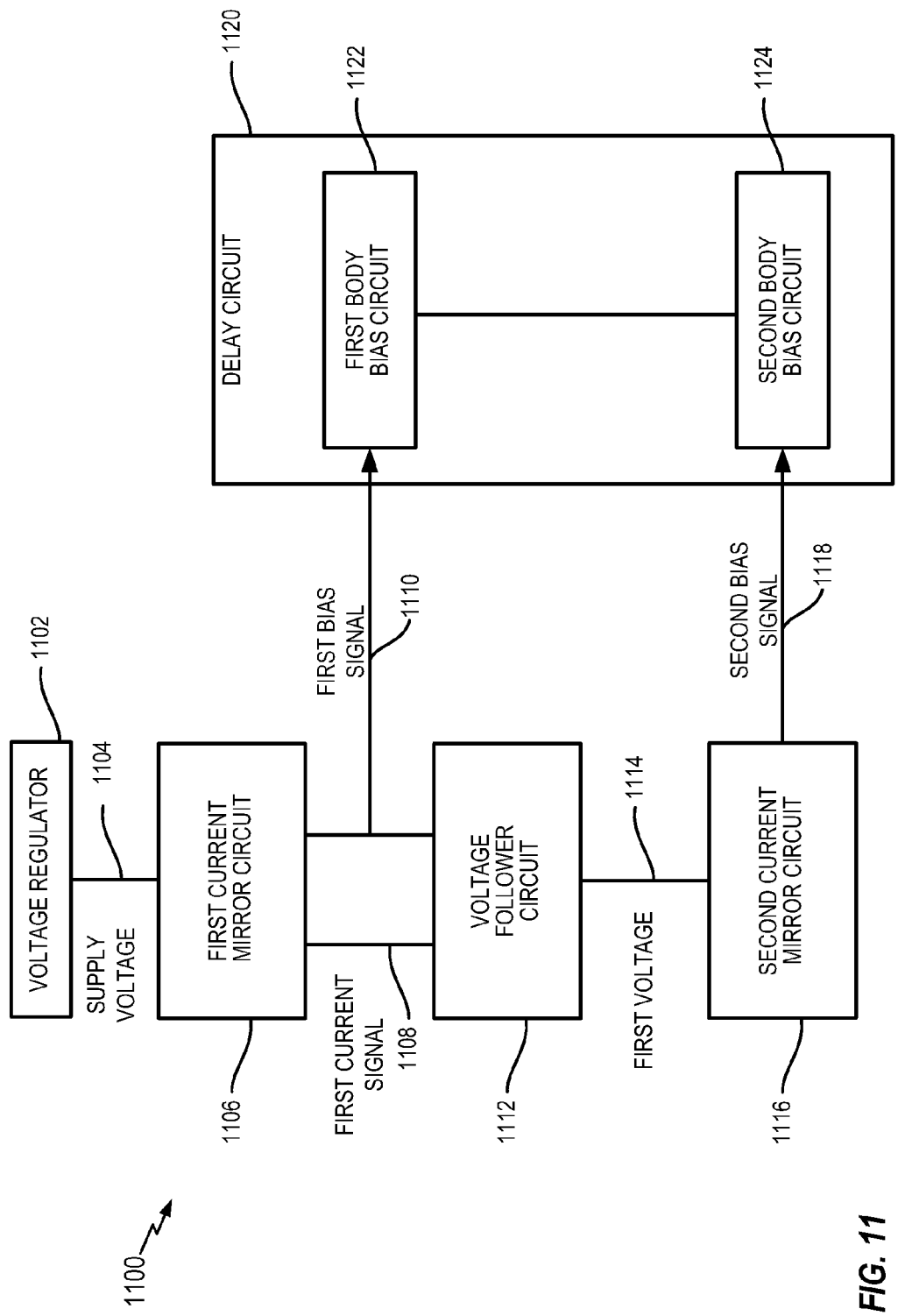
FIG. 11 is a block diagram illustrating sample components of an example of a feed-forward bias compensation circuit in accordance with some aspects of the disclosure.

Turning now to FIG. 11, a block diagram is shown illustrating select components of an apparatus 1100 according to at least one example of the disclosure. The apparatus 1100 includes a voltage regulator 1102 configured to supply a supply voltage 1104 to a first current mirror circuit 1106. In some implementations, the voltage regulator 1102 takes the form of the LDO voltage regulator 602 of FIG. 6.

The first current mirror circuit 1106 supplies a first current signal 1108 and a first bias signal 1110. In some implementations, the first current mirror circuit 1106 takes the form of the current mirror represented by the block 704 of FIG. 7.

A voltage follower circuit 1112 generates a first voltage 1114 based on the first bias signal 1110 and, in some aspects, based on the first current signal 1108. In some implementations, the voltage follower circuit 1112 takes the form of the voltage follower represented by the block 702 of FIG. 7.

A second current mirror circuit 1116 generates a second bias signal 1118 based on the first voltage 1114. In some implementations, the second current mirror circuit 1116 takes the form of the current mirror represented by the block 706 of FIG. 7.

A delay circuit 1120 includes a first body bias circuit 1122 (e.g., a transistor) and a second body bias circuit 1124 (e.g., a transistor). The bias at the first body bias circuit 1122 is controlled by the first bias signal 1110. The bias at the second body bias circuit 1124 is controlled by the second bias signal 1118. In some implementations, the delay circuit 1120 takes the form of the delay circuit 902 of FIG. 9. In some implementations, the first and second body bias circuits 1122 and 1124 take the form of the delay cells 904A-904N of FIG. 9.

Figure 12:
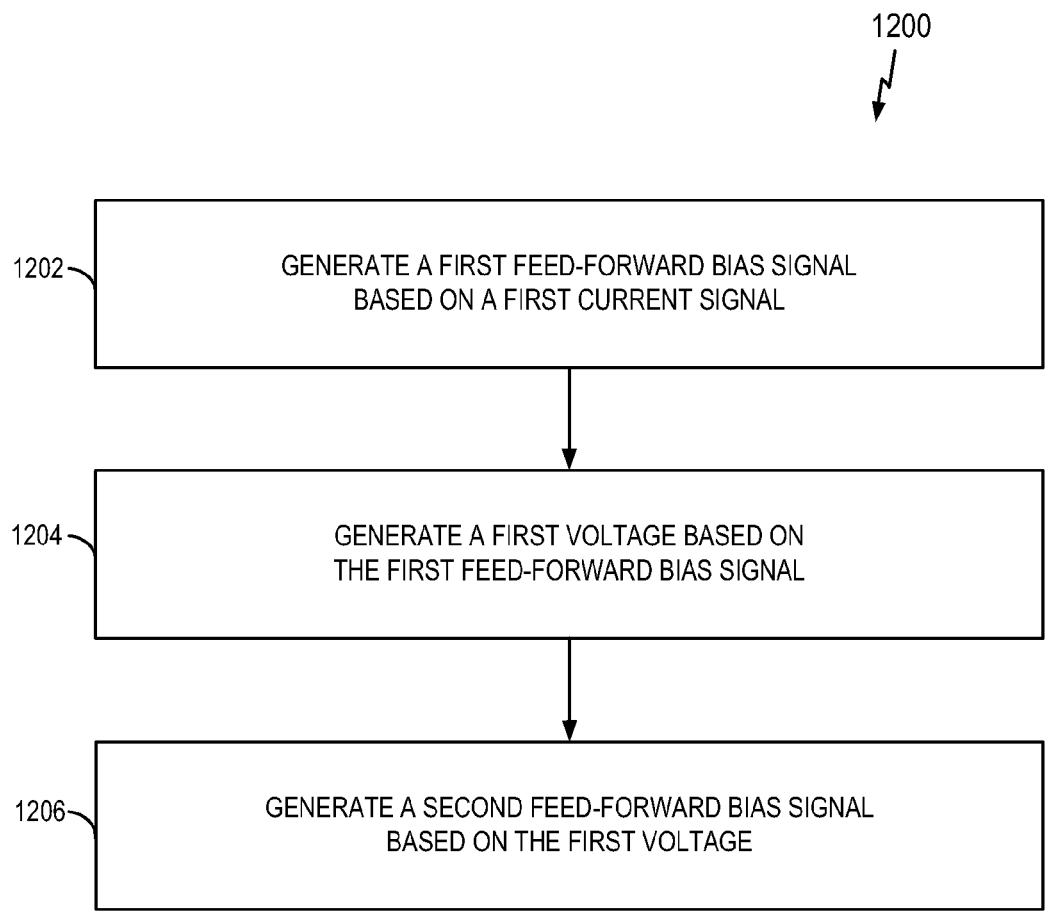
FIG. 12 is a flowchart illustrating an example of a bias signal generation method in accordance with some aspects of the disclosure.

FIG. 12 illustrates a process 1200 for generating bias signals in accordance with some aspects of the disclosure. The process 1200 may take place within a bias signal generator 304 (FIG. 3), which may be located in a transceiver or some other suitable apparatus. Of course, in various aspects within the scope of the disclosure, the process 1200 may be implemented by any suitable apparatus capable of supporting biasing operations.

At block 1202, a first feed-forward bias signal is generated based on a first current signal. For example, with reference to FIG. 5, the signal Vp may be generated based, at least in part, on the current I1.

At block 1204, a first voltage is generated based on the first feed-forward bias signal. For example, with reference to FIG. 5, the signal Vd1 may be generated based, at least in part, on the signal Vp.

At block 1206, a second feed-forward bias signal is generated based on the first voltage. For example, with reference to FIG. 5, the signal Vn may be generated based, at least in part, on the voltage Vd1.

Figure 13:
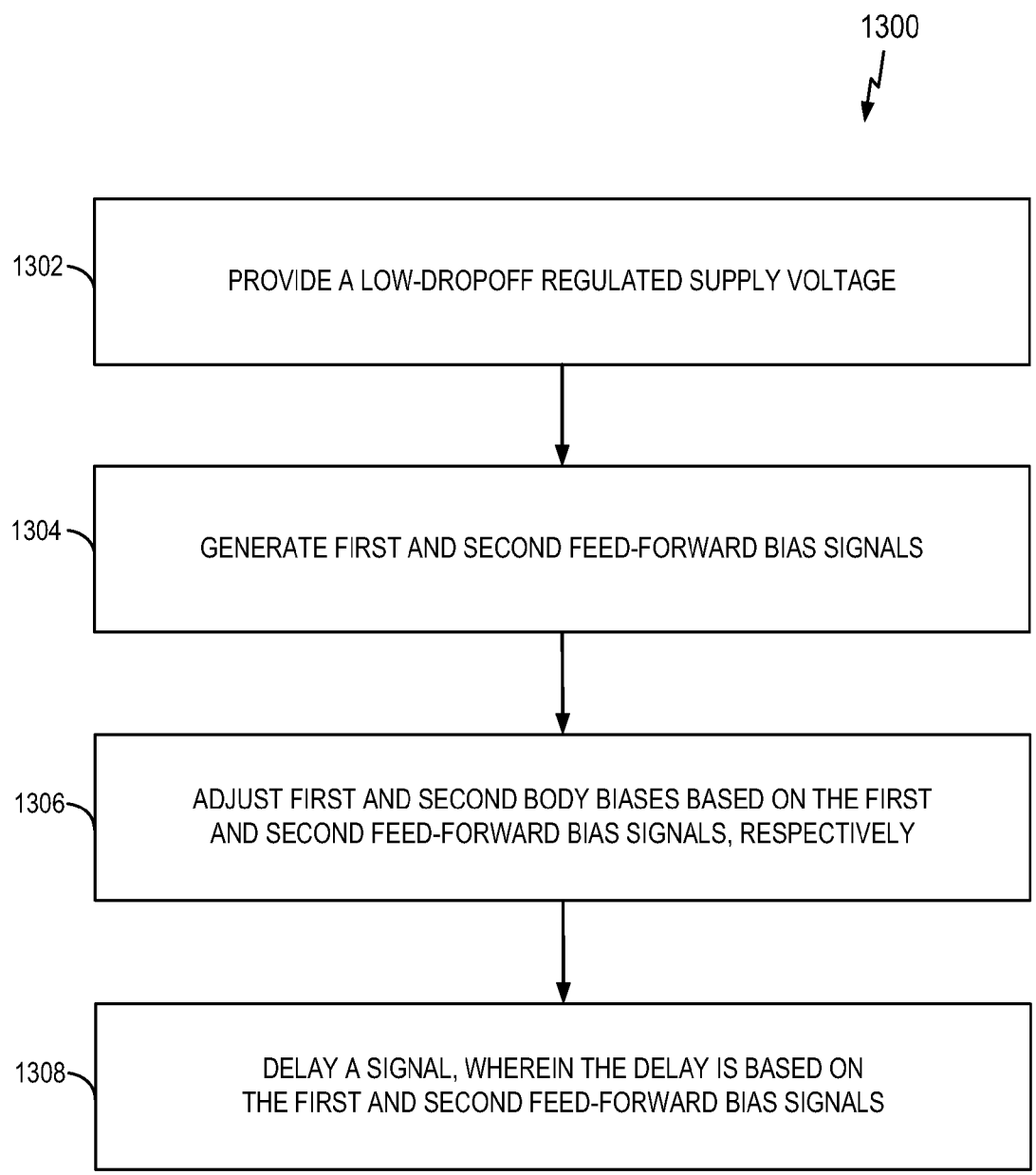
FIG. 13 is a flowchart illustrating an example of a feed-forward bias compensation method in accordance with some aspects of the disclosure.

FIG. 13 illustrates a process 1300 for delaying a signal based on the bias signals generated at FIG. 12 in accordance with some aspects of the disclosure. The process 1300 may take place within a compensation circuit 300 (FIG. 3), which may be located in a transceiver or some other suitable apparatus. Of course, in various aspects within the scope of the disclosure, the process 1300 may be implemented by any suitable apparatus capable of supporting biasing operations.

At block 1302, a low-dropoff regulated supply voltage is provided. For example, with reference to FIG. 6, the LDO voltage regulator 602 may generate Vdd-LDO.

At block 1304, first and second feed-forward bias signals are generated. The operations of block 1304 correspond to the operations of FIG. 12.

At block 1306, first and second body biases are adjusted based on the first and second feed-forward bias signals. For example, with reference to FIG. 4, the first and second bias signals Vbp and Vbn may control the bias at the first and second body bias terminals 406 and 408, respectively.

At block 1308, a signal is delayed based on the first and second feed-forward signals. For example, with reference to FIG. 4, the amount delay imparted by the circuit 402 on the input signal IN to generate the output signal OUT may depend on the bias at the first and second body bias terminals 406 and 408 which is based on the first and second bias signals Vbp and Vbn.

Figure 14:
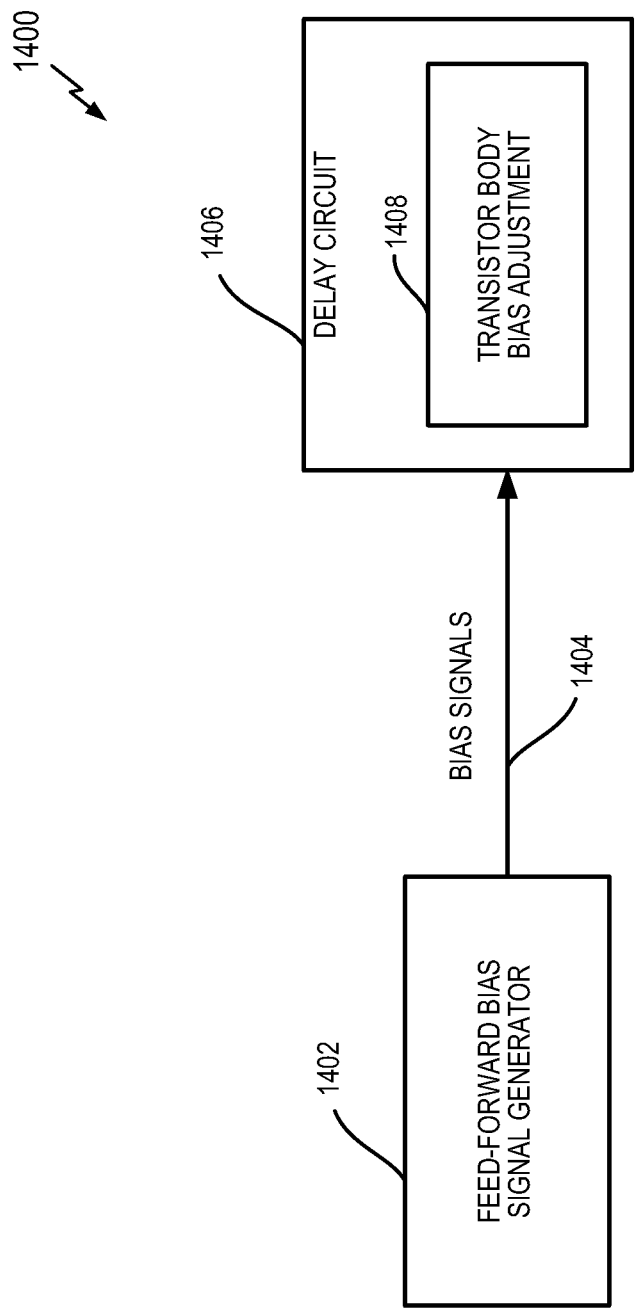
FIG. 14 is a block diagram illustrating sample components of another example of a feed-forward bias compensation circuit in accordance with some aspects of the disclosure.

Turning now to FIG. 14, a block diagram is shown illustrating select components of an apparatus 1400 according to at least one example of the disclosure. The apparatus 1400 includes a feed-forward bias signal generator 1402 that generates a plurality of bias signals 1404. In some implementations, the feed-forward bias signal generator 1402 takes the form of the feed-forward bias signal generator 600 of FIG. 6. The apparatus 1400 also includes a delay circuit 1406 having a transistor body bias adjustment component 1408 (e.g., transistors). In some implementations, the delay circuit 1406 takes the form of the delay circuit 902 of FIG. 9. In some implementations, the transistor body bias adjustment component 1408 takes the form of the delay cells 904A-904N of FIG. 9.

Figure 15:
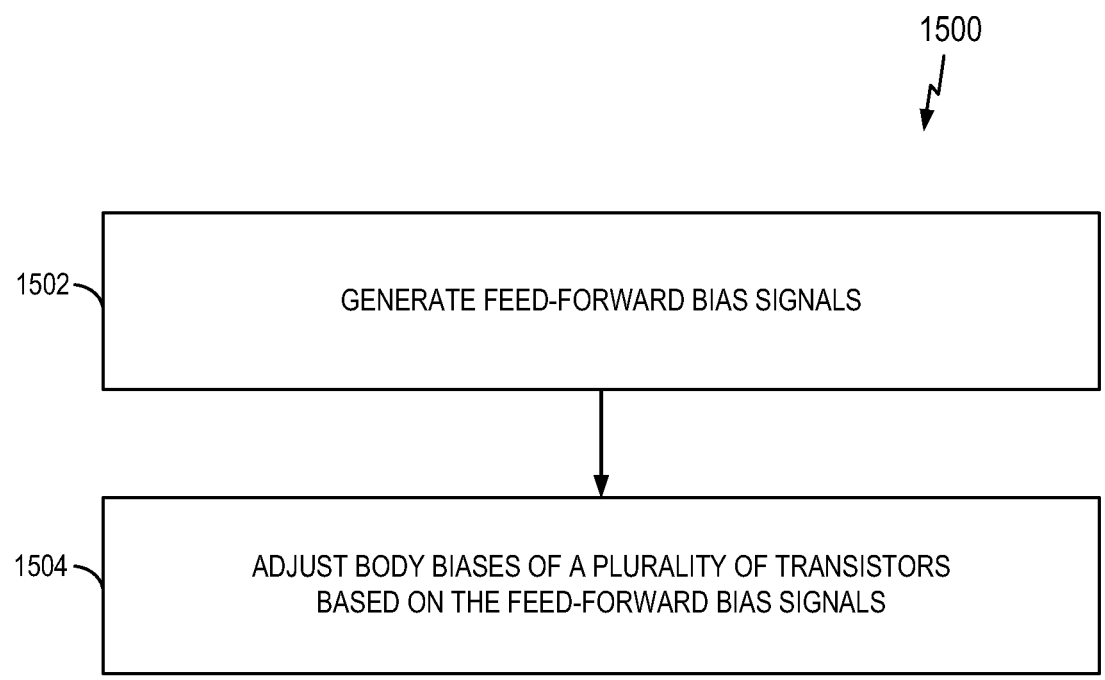
FIG. 15 is a flowchart illustrating an example of a feed-forward bias compensation method in accordance with some aspects of the disclosure.

FIG. 15 illustrates a process 1500 for bias compensation in accordance with some aspects of the disclosure. The process 1500 may take place within a compensation circuit 300 (FIG. 3), which may be located in a transceiver or some other suitable apparatus. Of course, in various aspects within the scope of the disclosure, the process 1500 may be implemented by any suitable apparatus capable of supporting biasing operations.

At block 1502, feed-forward bias signals are generated. The operations of block 1502 may correspond, for example, to the operations of FIG. 12.

In some aspects, the generation of the feed-forward bias signals comprises adjusting the feed-forward bias signals in response to at least one of a variation in temperature or a variation in voltage. For example, a change in temperature may reduce the delay through a delay circuit (e.g., due to an increase in carrier mobility). Accordingly, in response to a change in temperature (e.g., in response to an increase in carrier mobility), the feed-forward bias signal generator may automatically adjust the values of the first and second bias signals Vbp and Vbn (e.g., in the direction discussed above) to increase the delay through the delay circuit and thereby maintain a constant delay. As another example, a change in supply voltage may reduce the delay through a delay circuit (e.g., due to an increase in carrier mobility). Accordingly, in response to a change in supply voltage (e.g., in response to an increase in carrier mobility), the feed-forward bias signal generator may automatically adjust the values of the first and second bias signals Vbp and Vbn (e.g., in the direction discussed above) to increase the delay through the delay circuit and thereby maintain a constant delay.

At block 1504, body biases of a plurality of transistors are adjusted based on the feed-forward bias signals. For example, with reference to FIG. 4, the first and second bias signals Vbp and Vbn may control the bias at the first and second body bias terminals 406 and 408, respectively.

Figure 16:
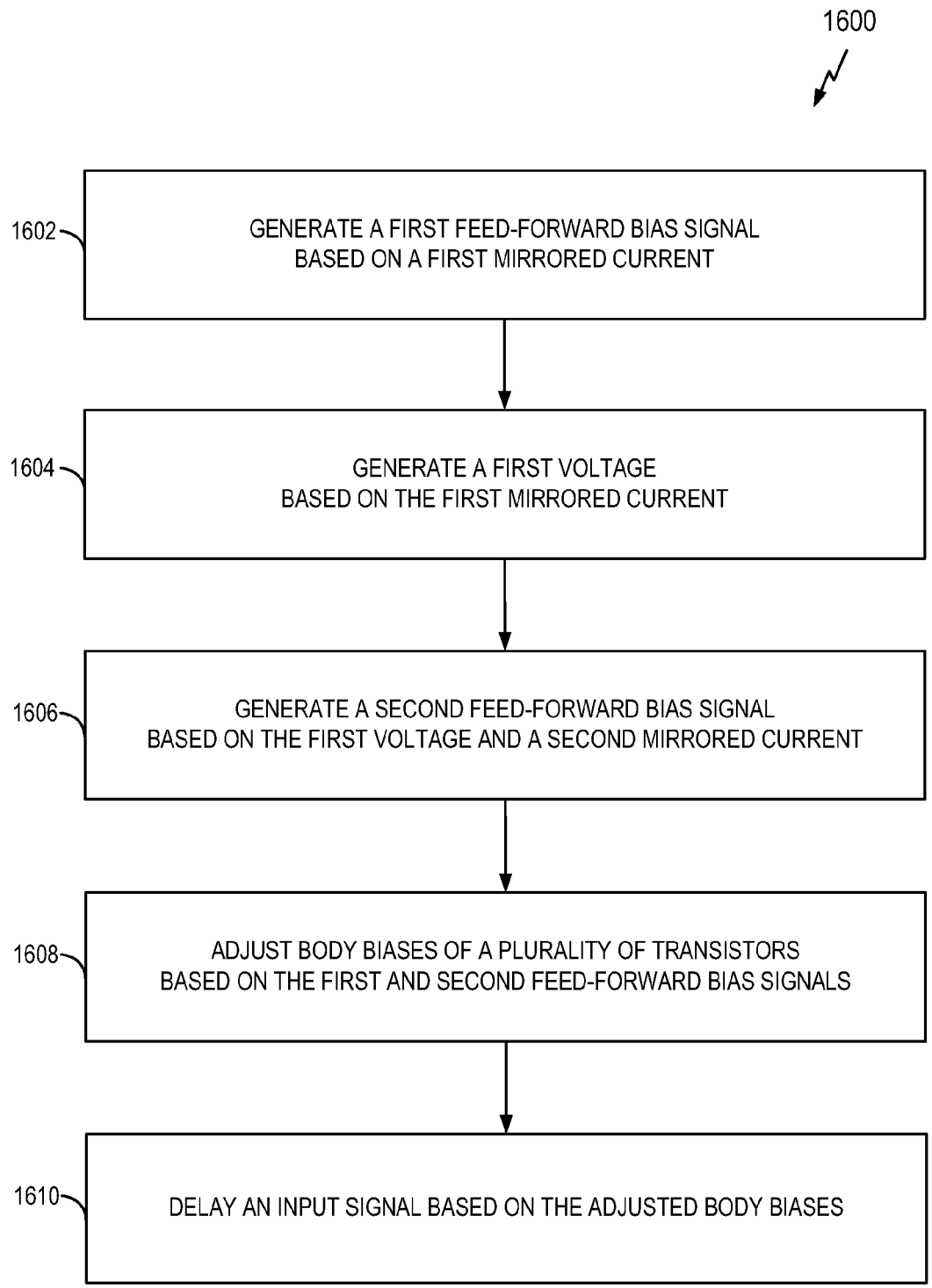
FIG. 16 is a flowchart illustrating additional aspects of an example of a feed-forward bias compensation method in accordance with some aspects of the disclosure.

FIG. 16 illustrates a process 1600 for delaying a signal in accordance with some aspects of the disclosure. The process 1600 may take place within a compensation circuit 300 (FIG. 3), which may be located in a transceiver or some other suitable apparatus. Of course, in various aspects within the scope of the disclosure, the process 1600 may be implemented by any suitable apparatus capable of supporting biasing operations.

At block 1602, a first feed-forward bias signal is generated based on a first mirrored current. For example, with reference to FIG. 5, the signal Vp may be generated based, at least in part, on the current I2 which is mirrored with respect to the current I1.

At block 1604, a first voltage is generated based on the first mirrored current. For example, with reference to FIG. 5, the signal Vd1 may be generated based, at least in part, on the signal Vp which is based, at least in part, on the current I2.

At block 1606, a second feed-forward bias signal is generated based on the first voltage and a second mirrored current. For example, with reference to FIG. 5, the signal Vn may be generated based, at least in part, on the voltage Vd1 and based on the current I4 which is mirrored with respect to the current I3.

At block 1608, body biases of a plurality of transistors are adjusted based on the first and second feed-forward bias signals. For example, with reference to FIG. 4, the first and second bias signals Vbp and Vbn may control the bias at the first and second body bias terminals 406 and 408, respectively.

At block 1610, an input signal is delayed based on the adjusted body biases. For example, with reference to FIG. 4, the amount of delay imparted by the circuit 402 on the input signal IN to generate the output signal OUT may depend on the bias at the first and second body bias terminals 406 and 408 which is based on the first and second bias signals Vbp and Vbn.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein. Additional elements, components, steps, and/or functions may also be added or not utilized without departing from the disclosure.

While features of the disclosure may have been discussed relative to certain implementations and figures, all implementations of the disclosure can include one or more of the advantageous features discussed herein. In other words, while one or more implementations may have been discussed as having certain advantageous features, one or more of such features may also be used in accordance with any of the various implementations discussed herein. In similar fashion, while exemplary implementations may have been discussed herein as device, system, or method implementations, it should be understood that such exemplary implementations can be implemented in various devices, systems, and methods.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. In some aspects, a process may correspond to a method, a function, a procedure, a subroutine, a subprogram, etc. When a process corresponds to a function, its termination corresponds to a return of the function to the calling function or the main function. One or more of the various methods described herein may be partially or fully implemented by programming (e.g., instructions and/or data) that may be stored in a machine-readable, computer-readable, and/or processor-readable storage medium, and executed by one or more processors, machines and/or devices.

Those of skill in the art would further appreciate that the various illustrative logical blocks, modules, circuits, and algorithm steps described in connection with the implementations disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

Within the disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the disclosure, without limitation as to the type of electronic circuits, as well as software implementations of information and instructions that, when executed by a processor, enable the performance of the functions described in the disclosure.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

Accordingly, the various features associate with the examples described herein and shown in the accompanying drawings can be implemented in different examples and implementations without departing from the scope of the disclosure. Therefore, although certain specific constructions and arrangements have been described and shown in the accompanying drawings, such implementations are merely illustrative and not restrictive of the scope of the disclosure, since various other additions and modifications to, and deletions from, the described implementations will be apparent to one of ordinary skill in the art. Thus, the scope of the disclosure is only determined by the literal language, and legal equivalents, of the claims which follow.

What is claimed is:

1. An apparatus employing power saving bias signaling, comprising:
   a first current mirror circuit to generate a first bias signal based on a first current signal;
   a voltage follower circuit coupled the first current mirror circuit to generate a first voltage based on the first bias signal;
   a second current mirror circuit, coupled to the voltage follower circuit, to generate a second bias signal based on the first voltage, wherein the first bias signal and the second bias signal are feed-forward bias signals to thereby reduce power consumption; and
   a first transistor having a first drain terminal, a first gate terminal, and a first source terminal, wherein the first drain terminal and the first gate terminal are configured to receive the first bias signal via coupling to the first current mirror circuit, and wherein the first source terminal is coupled to the second current mirror circuit.

2. The apparatus of claim 1, further comprising a delay circuit embodying the first transistor and the second transistor.

3. The apparatus of claim 1, wherein the first and second current mirror circuits are configured to adjust the first and second bias signals in response to at least one of a variation in temperature at the apparatus or a variation in voltage at the apparatus.

4. The apparatus of claim 1, wherein the first and second current mirror circuits are configured to generate the first and second bias signals at different levels for different process corners.

5. The apparatus of claim 1, wherein:
   the first current mirror circuit has a transfer ratio of at least 2:1; and
   the second current mirror circuit has a transfer ratio of at least 3:1.

6. The apparatus of claim 1, further comprising a low-dropoff regulator coupled to the first current mirror circuit to provide a supply voltage to the first current mirror circuit.

7. The apparatus of claim 1, wherein the voltage follower circuit comprises a second transistor to provide the first voltage.

8. The apparatus of claim 7, wherein the first current mirror circuit comprises:
   a third transistor to provide the first current signal to the second transistor; and
   a fourth transistor coupled to the third transistor to provide the first bias signal to the second transistor.

9. The apparatus of claim 8, wherein the second current mirror circuit comprises:
   a fifth transistor to receive the first voltage from the second transistor; and
   a sixth transistor coupled to the fifth transistor to provide the second bias signal.

10. The apparatus of claim 9, wherein the fifth transistor comprises a second source terminal, the sixth transistor comprises a third source terminal, and wherein the first source terminal is coupled to (i) the second source terminal, (ii) the third source terminal, and (iii) one of a ground or a negative voltage supply.

11. The apparatus of claim 1, further comprising a second transistor having a second drain terminal, a second gate terminal, and a second source terminal, wherein the second drain terminal is directly coupled to the second gate terminal and configured to receive the second bias signal via direct coupling to the second current mirror circuit, and wherein the second source terminal is directly coupled to a positive voltage source.

12. An apparatus employing power saving bias signaling, comprising:
    a feed-forward bias signal generator for reducing power consumption, comprising:
        a first current mirror circuit to generate a first bias signal,
        a voltage follower circuit coupled the first current mirror circuit to generate a first voltage based on the first bias signal,
        a second current mirror circuit to generate a second bias signal based on the first voltage, and
        a first transistor having a first drain terminal, a first gate terminal, and a first source terminal, wherein the first drain terminal and the first gate terminal are configured to receive the first bias signal via coupling to the first current mirror circuit, and wherein the first source terminal is coupled to the second current mirror circuit; and
    a circuit comprising a plurality of transistors, each of the plurality of transistors comprising a body bias terminal coupled to the feed-forward bias signal generator to receive a respective one of the bias signals.

13. The apparatus of claim 12, wherein:
    the plurality of transistors comprise a second transistor and a third transistor;
    the second transistor is a p-channel transistor and comprises a first body bias terminal to receive the first bias signal; and
    the third transistor is an n-channel transistor and comprises a second body bias terminal to receive the second bias signal.

14. The apparatus of claim 12, wherein the voltage follower circuit comprises a second drain terminal, a second gate terminal, and a second source terminal, and wherein the second drain terminal is coupled to the first current mirror circuit, the second gate terminal receives the first bias signal, and the second source terminal is coupled to the second current mirror circuit.

15. The apparatus of claim 12, wherein the apparatus is a transceiver configured to transmit and receive radio frequency signals via at least one antenna.

16. The apparatus of claim 12, wherein the power saving bias signaling comprises the feed-forward bias signal generator, wherein the feed-forward bias signal generator is configured to track variations in process, voltage, and temperature, and wherein the first bias signal and the second bias signal are generated based on the variations.

17. A method employing power saving bias signaling, comprising:
    generating a plurality of feed-forward bias signals to reduce power consumption, the plurality of feed-forward bias signals generated via a first current mirror circuit and a second current mirror circuit, wherein:
        a first one of the feed-forward bias signals is generated based on a first mirrored current and a resistance of a first transistor, the first transistor having a first drain terminal, a first gate terminal, and a first source terminal, wherein the first drain terminal and the first gate terminal are configured to receive the first one of the feed-forward bias signals via coupling to the first current mirror circuit, and wherein the first source terminal is coupled to the second current mirror circuit; and
        a second one of the feed-forward bias signals is generated based on a second mirrored current and a resistance of a second transistor; and
    adjusting a plurality of body biases of a plurality of transistors based on the feed-forward bias signals.

18. The method of claim 17, wherein the generation of the feed-forward bias signals comprises adjusting the feed-forward bias signals in response to at least one of a variation in temperature or a variation in voltage.

19. The method of claim 17, further comprising generating a first voltage based on the first feed-forward bias signal, wherein the second feed-forward bias signal is generated based on the first voltage.

20. The method of claim 17, wherein the plurality of transistors further comprise:
    a third transistor being a p-channel transistor; and
    a fourth transistor being an n-channel transistor, and wherein
    the first feed-forward bias signal provided to a first body bias terminal of the third transistor has a first signal level that is different from a second signal level of the second feed-forward bias signal provided to a second body bias terminal of the fourth transistor.

21. The method of claim 17, further comprising delaying an input signal coupled to the plurality of transistors to provide a delayed output signal, wherein the delay is based on the adjusted body biases.

22. An apparatus employing power saving bias signaling, comprising:
    a first pair of gate-coupled transistors to generate a first bias signal based on a first current signal;
    a first transistor coupled to the first pair of gate-coupled transistors to generate a first voltage based on the first bias signal;
    a second pair of gate-coupled transistors, coupled to the first transistor, to generate a second bias signal based on the first voltage; and
    a second transistor comprising a first drain terminal, a first gate terminal, and a first source terminal,
    wherein the first bias signal and the second bias signal are feed-forward bias signals to thereby reduce power consumption,
    wherein the first drain terminal and the first gate terminal receive the first bias signal, and
    wherein the first drain terminal and the first gate terminal are coupled to one of the first pair of gate coupled transistors.

23. The apparatus of claim 22, wherein the first pair of gate-coupled transistors comprises:
    a third transistor comprising a second drain terminal to provide the first current signal; and
    a fourth transistor comprising a third drain terminal to provide the first bias signal.

24. The apparatus of claim 23, wherein:
    the second pair of gate-coupled transistors comprises a fifth transistor comprising a second gate terminal coupled to the first transistor to receive the first voltage;
    the second pair of gate-coupled transistors comprises a sixth transistor comprising a third gate terminal coupled to the second gate terminal; and the sixth transistor comprises a fourth drain terminal to provide the second bias signal.

25. The apparatus of claim 22, wherein the first transistor comprises:
a second drain terminal coupled to the first pair of gate-coupled transistors to receive the first current signal;
a second gate terminal coupled to the first pair of gate-coupled transistors to receive the first bias signal; and
a second source terminal coupled to the second pair of gate-coupled transistors to provide the first voltage.

26. The apparatus of claim 25, wherein:
the first pair of gate-coupled transistors comprises a third transistor and a fourth transistor;
the third transistor comprises a third gate terminal, a third source terminal, and a third drain terminal; and
the fourth transistor comprises a fourth gate terminal, a fourth source terminal, and a fourth drain terminal;
the third source terminal and the fourth source terminal are coupled to a supply voltage source;
the third gate terminal is coupled to the fourth gate terminal and the third drain terminal;
the third drain terminal is coupled to the second drain terminal to provide the first current signal to the first transistor; and
the fourth drain terminal is coupled to the second gate terminal to provide the first bias signal to the first transistor.

27. The apparatus of claim 25, wherein:
the second pair of gate-coupled transistors comprises a third transistor and a fourth transistor;
the third transistor comprises a third gate terminal, a third source terminal, and a third drain terminal; and
the fourth transistor comprises a fourth gate terminal, a fourth source terminal, and a fourth drain terminal;
the third source terminal and the fourth source terminal are coupled;
the third gate terminal is coupled to the fourth gate terminal and the third drain terminal;
the second source terminal is coupled to the third drain terminal to provide the first voltage to the third transistor; and
the fourth drain terminal is coupled to both of a fifth drain terminal and a fifth gate terminal of a fifth transistor to provide the second bias signal, the fifth transistor having a fifth source terminal coupled to a supply voltage source.

28. The apparatus of claim 22, wherein the first source terminal is coupled to each of the second pair of gate-coupled transistors.

29. The apparatus of claim 22, wherein each of the second pair of gate-coupled transistors comprise a source terminal directly coupled to the first source terminal.

30. The apparatus of claim 22, wherein the first transistor comprises:
a second drain terminal directly coupled to both gate terminals of the first pair of gate-coupled transistors;
a second gate terminal directly coupled to one of the first pair of gate-coupled transistors to receive the first bias signal; and
a second source terminal directly coupled to both gate terminals of the second pair of gate-coupled transistors.

* * * * *

UNITED STATES PATENT AND TRADEMARK OFFICE
CERTIFICATE OF CORRECTION

PATENT NO. : 9,998,099 B2
APPLICATION NO. : 14/384374
DATED : June 12, 2018
INVENTOR(S) : Su et al.

Page 1 of 1

It is certified that error appears in the above-identified patent and that said Letters Patent is hereby corrected as shown below:

In the Claims

Column 16, Lines 30-32 (approx.) Claim 2 can be amended to read:
The apparatus of claim 1, further comprising a delay circuit embodying the first transistor and a second transistor.

Signed and Sealed this
Twelfth Day of March, 2019

Andrei Iancu
*Director of the United States Patent and Trademark Office*